(12) United States Patent
Jiang

(10) Patent No.: US 9,276,587 B2
(45) Date of Patent: Mar. 1, 2016

(54) CLOCK GENERATION SYSTEM

(71) Applicant: Broadcom Corporation, Irvine, CA (US)

(72) Inventor: Xicheng Jiang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/047,306

(22) Filed: Oct. 7, 2013

(65) Prior Publication Data

US 2015/0097627 A1 Apr. 9, 2015

Related U.S. Application Data

(60) Provisional application No. 61/886,795, filed on Oct. 4, 2013.

(51) Int. Cl.
*H03L 7/00* (2006.01)
*H03L 7/06* (2006.01)
*H03L 7/099* (2006.01)

(52) U.S. Cl.
CPC .. *H03L 7/06* (2013.01); *H03L 7/00* (2013.01); *H03L 7/099* (2013.01)

(58) Field of Classification Search
CPC ..... H04W 84/00; H04W 8/245; H04W 16/14; H04W 28/22; H04W 56/0085; H04W 64/00; H04W 72/10; H04W 74/04; H03L 7/07; H03L 1/00; H03L 1/026; H03L 7/0812; H03L 7/1976; H03L 7/22; H03L 7/081; H03L 7/0994; H03L 7/099; H03L 7/18; H03B 5/04; H03B 5/1215; H03B 5/1228; H03B 5/1253; H03B 5/1278; H03B 5/1296; H03B 5/366
USPC ......... 331/2, 46, 18, 34, 1 A, 16, 25; 327/156
See application file for complete search history.

(56) References Cited

U.S. PATENT DOCUMENTS

| 5,726,607 | A   | * | 3/1998  | Brede et al. ................. 331/2 |
|-----------|-----|---|---------|--------------------------------------|
| 6,725,067 | B1  | * | 4/2004  | Marx et al. ................... 455/574 |
| 7,216,249 | B2  |   | 5/2007  | Fujiwara et al.                      |
| 7,276,949 | B2  |   | 10/2007 | Johnson                              |
| 7,812,658 | B2  |   | 10/2010 | Rim                                  |
| 7,885,612 | B2  |   | 2/2011  | Osada                                |
| 7,890,787 | B2  | * | 2/2011  | Bradley et al. ............... 713/500 |
| 8,024,598 | B2  |   | 9/2011  | Kim et al.                           |
| 8,077,012 | B2  | * | 12/2011 | Batra et al. .................. 340/10.1 |
| 8,836,388 | B2  | * | 9/2014  | Lee et al. ..................... 327/156 |
| 2010/0214029 | A1 | * | 8/2010 | McDonald et al. ............ 331/18 |
| 2011/0148486 | A1 |   | 6/2011 | Mosalikanti et al.                  |

* cited by examiner

*Primary Examiner* — Arnold Kinkead
(74) *Attorney, Agent, or Firm* — Brinks Gilson & Lione

(57) ABSTRACT

A clock generation system provides a low power approach for generating clock signals. The clock generation system may use a free running clock and, at intervals, maintain the accuracy of the free running clock. The free running clock may be the source of other system clocks, such as a 32 KHz clock for system timing and a 13 MHz clock to facilitate audio playback, e.g., MP3 decoding and playback. The clock generation system eliminates the need for two different crystal oscillators and a complex PLL for generating the low frequency clock.

20 Claims, 5 Drawing Sheets

US 9,276,587 B2

CLOCK GENERATION SYSTEM

CROSS REFERENCE TO RELATED APPLICATIONS

This application claims priority to provisional application Ser. No. 61/886,795, filed Oct. 4, 2013, which is incorporated by reference in its entirety.

TECHNICAL FIELD

This disclosure relates to clock generation techniques for electronic devices.

BACKGROUND

Rapid advances in electronics and communication technologies, driven by immense customer demand, have resulted in the widespread adoption of mobile communication devices. Many of these devices, e.g., smartphones, have sophisticated processing capability and rely on clocks of different frequencies to perform different processing tasks, e.g., decoding and playback of encoded audio files. In most of such devices, energy consumption is of interest, and reduced energy consumption is often a design goal.

DETAILED DESCRIPTION

Figure 1:
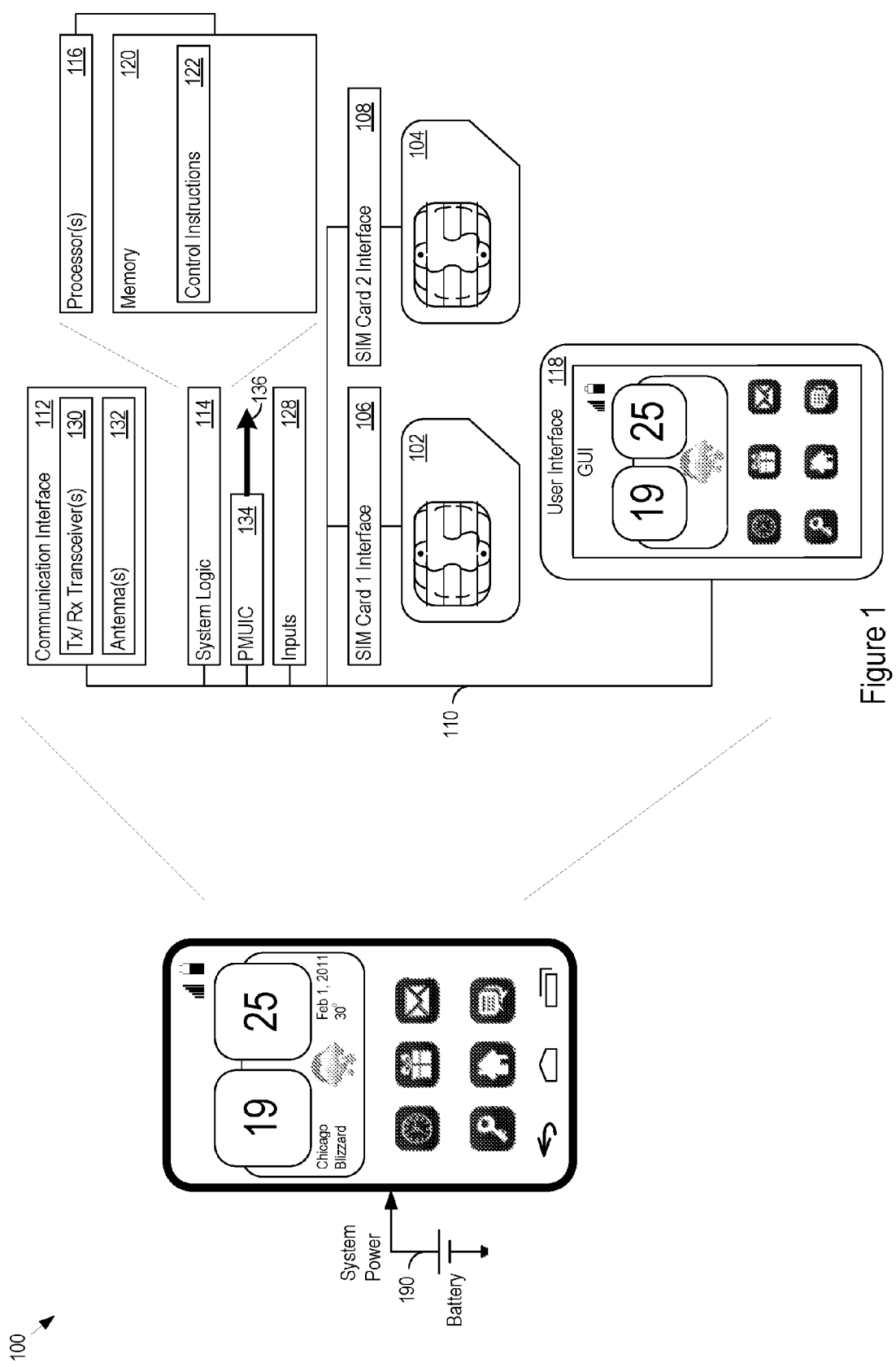
FIG. 1 shows an example of a mobile electronic device.

FIG. 1 shows an example of a mobile electronic device 100 ("device 100"). The device 100 is a smartphone in this example, but the device may be any electronic device, and may run from an energy limited power source such as the battery 190. The techniques described below for clock generation are applicable for power saving in virtually any electronic device. Accordingly, the smartphone example described below provides just one example context for explaining the clock generation power saving techniques. In other words, the smartphone is only one example of a wide array of electronic devices that may incorporate the power saving techniques.

The device 100 may support one or more Subscriber Identity Modules (SIMs), such as the SIM1 102 and the SIM2 104. Electrical and physical interfaces 106 and 108 connect SIM1 102 and SIM2 104 to the rest of the device hardware, for example, through the system bus 110. The system bus 110 may include address, data, and control signals.

The device 100 includes a power management unit integrated circuit (PMUIC) 134. In a complex device like a smartphone, the PMUIC 134 may be responsible for generating as many as thirty (30) different power supply rails 136 for the circuitry in the phone. As will be described in more detail below, the PMUIC uses a 32 KHz clock for different purposes, including system timing. The clock generation techniques discussed below provide one way to generate the 32 KHz clock to the PMUIC 134 and other system logic, without requiring a separate 32 KHz crystal oscillator.

The circuitry in the device 100 also includes a communication interface 112, system logic 114, and a user interface 118. The system logic 114 may include any combination of hardware, software, firmware, or other logic. The system logic 114 may be implemented, for example, in a system on a chip (SoC), application specific integrated circuit (ASIC), or other circuitry. The system logic 114 is part of the implementation of any desired functionality in the device 100. In that regard, the system logic 114 may include logic that facilitates, as examples, decoding and playing music, e.g., MP3, FLAG, AC3, or WAV decoding playback; running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The system logic 114 may include one or more processors 116 and memories 120. The memory 120 stores, for example, control instructions 122 that the processor 116 executes to carry out any of the functionality offered by the device 100. The user interface 118 and other operator inputs 128 may include a graphical user interface, touch sensitive display, voice or facial recognition inputs, buttons, switches, speakers and other user interface elements.

In the communication interface 112, Radio Frequency (RF) transmit (Tx) and receive (Rx) transceivers 130 handle transmission and reception of signals through the antenna(s) 132. The communication interface 112 may include one or more transceivers. The transceivers may be wireless transceivers that include modulation/demodulation circuitry, digital to analog converters (DACs), shaping tables, analog to digital converters (ADCs), filters, waveform shapers, filters, pre-amplifiers, power amplifiers and/or other logic for transmitting and receiving through one or more antennas, or (for some devices) through a physical (e.g., wireline) medium.

Figure 2:
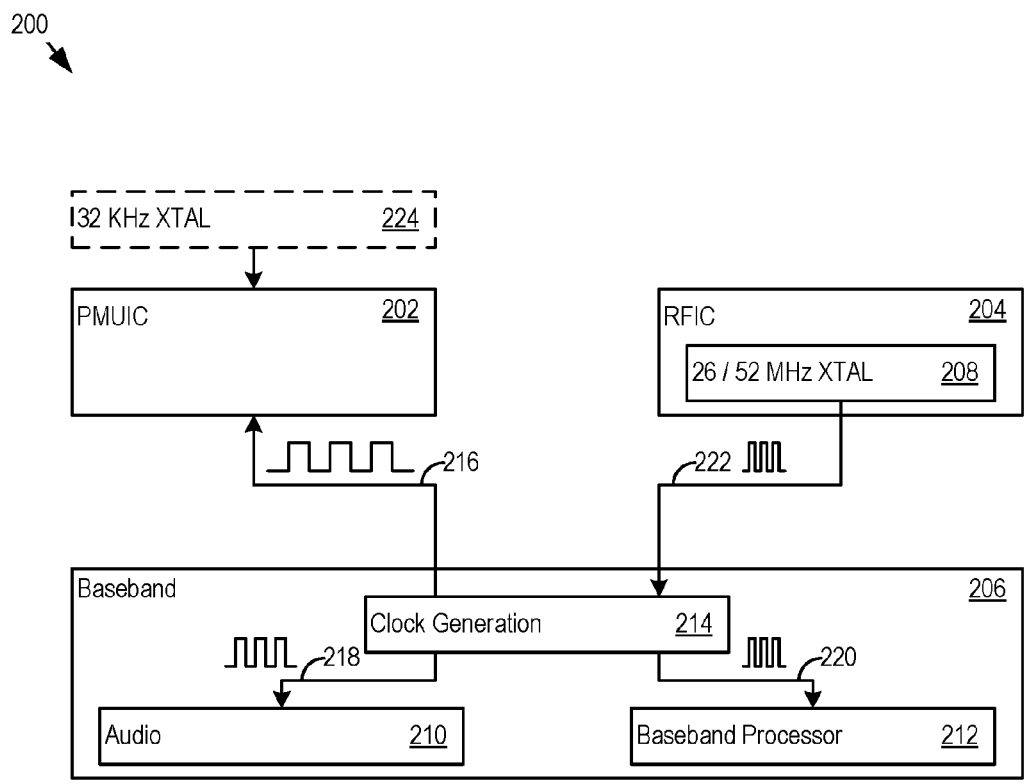
FIG. 2 is an example of system and communication logic.

FIG. 2 shows, in more detail, example system and communication logic 200 that the device 100 may include. The system logic 200 includes a PMUIC 202, a Radio Frequency (RF) Integrated Circuit (RFIC) 204, and baseband logic 206. The RFIC 204 includes a clock source 208, such as a 26 MHz crystal oscillator, a 52 MHz crystal oscillator, or another clock source. The clock source 208 may be a high frequency clock source (e.g., a high frequency cellular communication reference clock) that meets a specified operational requirement such as stability and accuracy. The operational requirements may be specified with respect to cellular communications, as one example, so that the clock source 208 may be used to generate frequencies that the RF circuitry uses for upconversion and downconversion, modulation and demodulation, and other tasks with high-fidelity clock requirements, such as less than 10 ps jitter for RF signal transmission, and better than 1 ppm (part per million) frequency accuracy for GPS tracking.

The baseband logic 206 may include many different types of hardware and software modules. In the example in FIG. 2, the baseband logic 206 includes audio processing logic 210, a baseband processor 212, and clock generation logic 214. The audio processing logic 210 may include hardware and software codecs for encoding or decoding any specified audio format, including MP3, as one example. The baseband processor 212 may carry out any desired processing, such as coding or decoding of the signals sent or received by the RF circuitry.

As just a few examples, the system logic 200 may include a BCM2091 EDGE/HSPA Multi-Mode, Multi-Band Cellular Transceiver controlled by a BCM28150 HSPA+ system-on-a-chip (SoC) baseband smartphone processor or a BCM25331 Athena™ baseband processor. The PMUIC may be a BCM59056, BCM59057 or BCM59059 power management unit, as examples. These devices or other similar system solutions may be extended in functionality as described below to provide the power saving functionality described below. These integrated circuits, as well as other hardware and software implementation options for the device 100, are available from Broadcom Corporation of Irvine Calif.

The clock generation logic 214 generates clocks for the PMUIC 202, the audio processing logic 210, the baseband processor 212, and other functional modules in the device 100. As examples, the clock generation logic 214 may generate a system reference clock 216 for the PMUIC 202 (e.g., a 32 KHz clock), an audio processing reference clock 218 for the audio processing logic 210 (e.g., a 13 MHz clock or 26 MHz clock), and a cellular reference clock 220 (e.g., a 26 MHz or 52 MHz clock) for the baseband processor 212. The clock generation logic 214 uses the reference clock 222 from the clock source 208 to generate the other clocks, as described below.

Note that in the design shown in FIG. 2, there is no need for a separate low frequency oscillator for, e.g., system timing and housekeeping operations. For instance, there is no need for a 32 KHz oscillator 224. Instead, the clock generation logic 214 may generate the system reference clock 216 for the PMUIC 202, as well as the other clocks. This is in contrast to a design in which both a 32 KHz oscillator 224 and a 26/52 MHz oscillator were included, with the 32 KHz oscillator 224 always running and consuming power to provide system timing and support housekeeping operations, with the 26/52 MHz oscillator selectively enabled to support cellular communications and audio processing.

Eliminating the low frequency oscillator reduces system cost and energy consumption. Eliminating the low frequency oscillator also eliminates the need for the PMUIC 202 to provide a 32 KHz clock driver, and eliminates a complex very low bandwidth Phase Locked Loop (PLL) that could process both the low frequency (e.g., 32 KHz clock) and the much higher frequency (e.g., the 26 MHz/52 MHz clock) and generate clocks for the system. More specifically, if the clock source 208 were not used for the audio processing logic 210, then the PLL would need to create the audio processing reference clock 218 from the low frequency clock source, or a separate additional PLL would be needed, adding to the system cost and complexity. On the other hand, if the clock source 208 were used for the audio processing reference clock 218, then substantial energy would be consumed whenever the device plays audio content, leading to rapid depletion of the battery 190.

Figure 3:
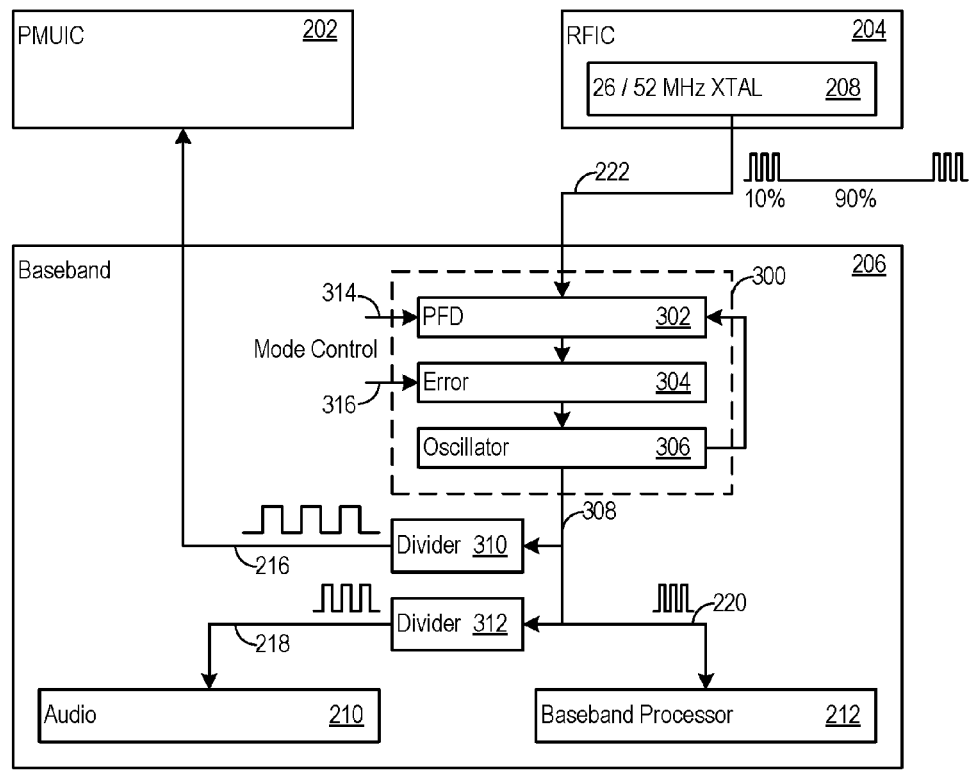
FIG. 3 shows an example of system logic that includes clock generation logic.

FIG. 3 shows an example of system logic that includes clock generation logic 300. In this example, the clock generation logic 300 is a PLL that includes a Phase/Frequency Detector (PFD) 302 and an error controller 304 that controls an oscillator 306. The oscillator 306 may be a low cost and low complexity oscillator. As examples, the oscillator 306 may be a Resistor Capacitor (RC) oscillator, an Inductor (L) Capacitor (LC) oscillator, a ring oscillator, or other type of oscillator.

The oscillator 306 includes a tuning structure that adjusts the output frequency of the oscillator 306. As one example, the tuning structure may include a capacitor bank. The error controller 304 may output control signals to the tuning structure. As an example, the output control signals may be switching control signals that cause one or more components, such as capacitors, to be added or removed from the RC, LC, or ring oscillator circuits, thereby changing the circuit parameters and changing the output frequency of the oscillator 306. In other implementations, the oscillator may employ a different tuning mechanism. For example, the oscillator 306 may be a voltage controlled oscillator (VCO) and the error controller 304 may be an error amplifier that applies a control voltage to the VCO.

The oscillator 306 generates a reference clock output 308. The reference clock output 308 may provide any desired output frequency. For instance, the reference clock output 308 may directly provide the cellular reference clock 220. Further, frequency dividers may be present and may generate, from the reference clock output 308, any other desired output frequencies. For instance, the frequency divider 310 generates the system reference clock 216, while the divider 312 provides the audio processing reference clock 218.

In addition, either or both of the mode control inputs 314 and 316 may be provided. The system may use the mode control inputs 314 and 316 to switch the clock generation logic 300 between free-running mode and calibrate-mode. The mode control input 314 may deactivate the PFD 302, including optionally disconnecting its output from the error controller 304, and disconnecting the oscillator feedback to the PFD 302. Similarly, the mode control input 316 may deactivate the error controller 304, including preventing the error controller 304 from making any changes to the configuration of the oscillator 306. Accordingly, the system may use either or both of the mode control inputs 314 and 316 to place the oscillator 306 into a free-running mode. In the free-running mode, the system does not actively correct the frequency output of the oscillator 306. Instead, the oscillator 306 continues to generate the reference clock output 308, which may be less accurate (e.g., may experience more drift and jitter) than it would experience in calibrate-mode.

However, in many instances, a somewhat less accurate reference output will not have a significant impact on the operation of the PMUIC 202, the audio processing logic 210, or other system logic. For instance, the low frequency system timing and housekeeping operations may not be detrimentally affected if the reference clock output 308 has somewhat increased jitter or drift. Similarly, the audio processing logic 210 may still generate consistent high quality audio output even using a reference clock that has somewhat increased jitter or drift.

In that regard, note that the clock source 208 may be active relatively infrequently. For instance, the clock source 208 may be active when the device 100 needs a very accurate reference clock for RF operations, e.g., cellular reception or transmission. The clock source 208 may therefore be inactive most of the time, e.g., 10% of the time active, and 90% of the time inactive.

When the clock source 208 is active, the system (e.g., the baseband processor 212) may control the mode control inputs 314 and 316 to set calibrate-mode for the oscillator 306. In calibrate-mode, the PFD 302 outputs a phase difference signal based on the different between the desired output and the actual output of the oscillator 306. The error controller 304 receives the phase difference signal and outputs an oscillator adjustment signal to the oscillator 306. As a result, the PFD 302 and error controller 304 use the clock source 208 to correct the output of the oscillator 306.

Note that the clock source 208 may be active relatively infrequently. For instance, the clock source 208 may be active when the device 100 will transmit or receive information from a cellular base station. As examples, the clock source 208 may be active when the device 100 checks for paging indicators, or when the device 100 is transmitting or receiving voice call data or network (e.g., Internet) data. As a result, the clock source 208 may be largely inactive, e.g., as much as 90% of the time, or more.

During the inactive periods, the clock generation logic 300 runs in free-running mode. In the free-running mode, the clock generation logic 300 and the dividers 310 and 312 continue to generate the system reference clock 216, the audio processing reference clock 218, and any other clocks (e.g., using additional dividers). As a result, the device 100 may continue to perform system timing and housekeeping operations, and the device 100 may continue to provide audio decoding services. That is, the clock source 208 does not need to be active all the time when audio decoding and system timing and housekeeping are active.

However, when the clock source 208 becomes active, then the clock generation logic 300 may run in calibrate-mode. The calibrate-mode re-calibrates the output of the oscillator 306. It is not necessary, however, to return to calibrate-mode every time that the clock source 208 becomes active.

Figure 4:
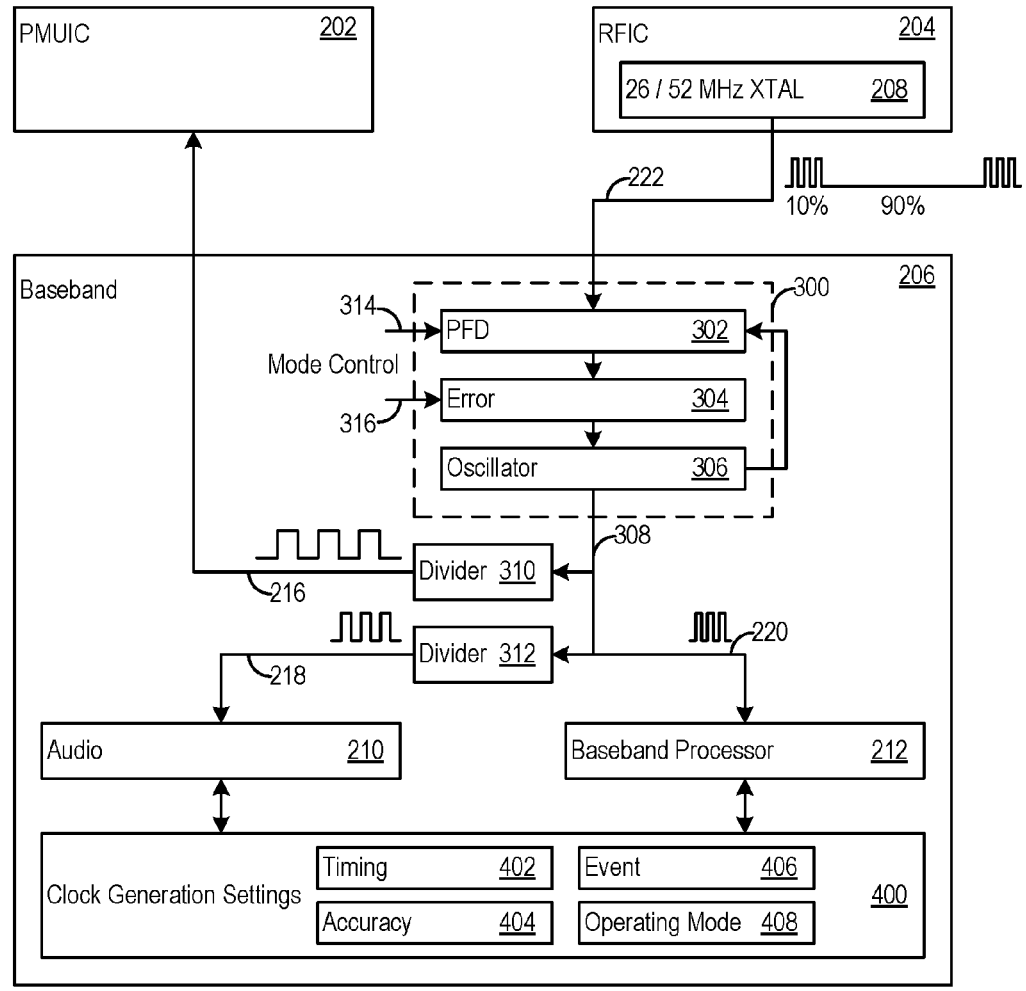
FIG. 4 shows an example of clock generation settings.

In that regard, FIG. 4 illustrates example clock generation settings 400. A memory may store the clock generation settings 400, and the memory may be coupled to any of the logic in the system. Accordingly, the audio processing logic 210, baseband processor 212, PMUIC 202, or any other logic may access, modify, or delete the clock generation settings 400.

The baseband processor 212 (or another controller) may selectively cause the clock generation logic 300 to enter calibrate-mode according to the clock generation settings 400. For instance, calibrate-mode may be engaged when a configured amount of time 402 has passed since the last calibrate-mode operation. As another example, the baseband processor 212 may engage calibrate-mode when the detected accuracy of the oscillator 306 has varied by more than a correction threshold 404, or after specific events 406 have occurred (e.g., the device has started an audio or video playback application). In other implementations, the calibrate-mode may be activated when the device is in specific operating modes 408. For example, the operating mode 408 may be Flight Mode or another mode in which cellular transmission and reception is disabled for the device 100 or that otherwise specifies a cellular communication connection capability. In that case, the operating mode 408 may specify that the oscillator 306 will be calibrated at specified intervals or specified times, because the clock source 208 would otherwise not be active. In that regard, whenever a clock generation setting 400 specifies calibration for the oscillator 306, the baseband processor 212 (or other control logic) may enable the clock source 208 and set the mode to calibrate-mode via the mode control inputs 314 and 316 for a predetermined length of time that achieves calibration of the oscillator 306. In other implementations, the audio processing logic 210, the PMUIC 202, or any other logic may specifically request calibrate-mode operation, or recalibration, of the oscillator 306. The request may be made to control logic such as the baseband processor 212, or may take the form of control signals issued directly to the clock source 208 and the mode control inputs 314 and 316.

As an example of the power savings, take as just one example a scenario in which the clock source 208 over time is 10% active and 90% inactive. If the current consumption of the clock source 208 is 2.5 mA, then allowing the oscillator 306 to run in free-running mode results in a 90% reduction in the current supplied to power the clock source 208 over time, i.e., to an average of 0.25 mA instead of 2.5 mA.

Figure 5:
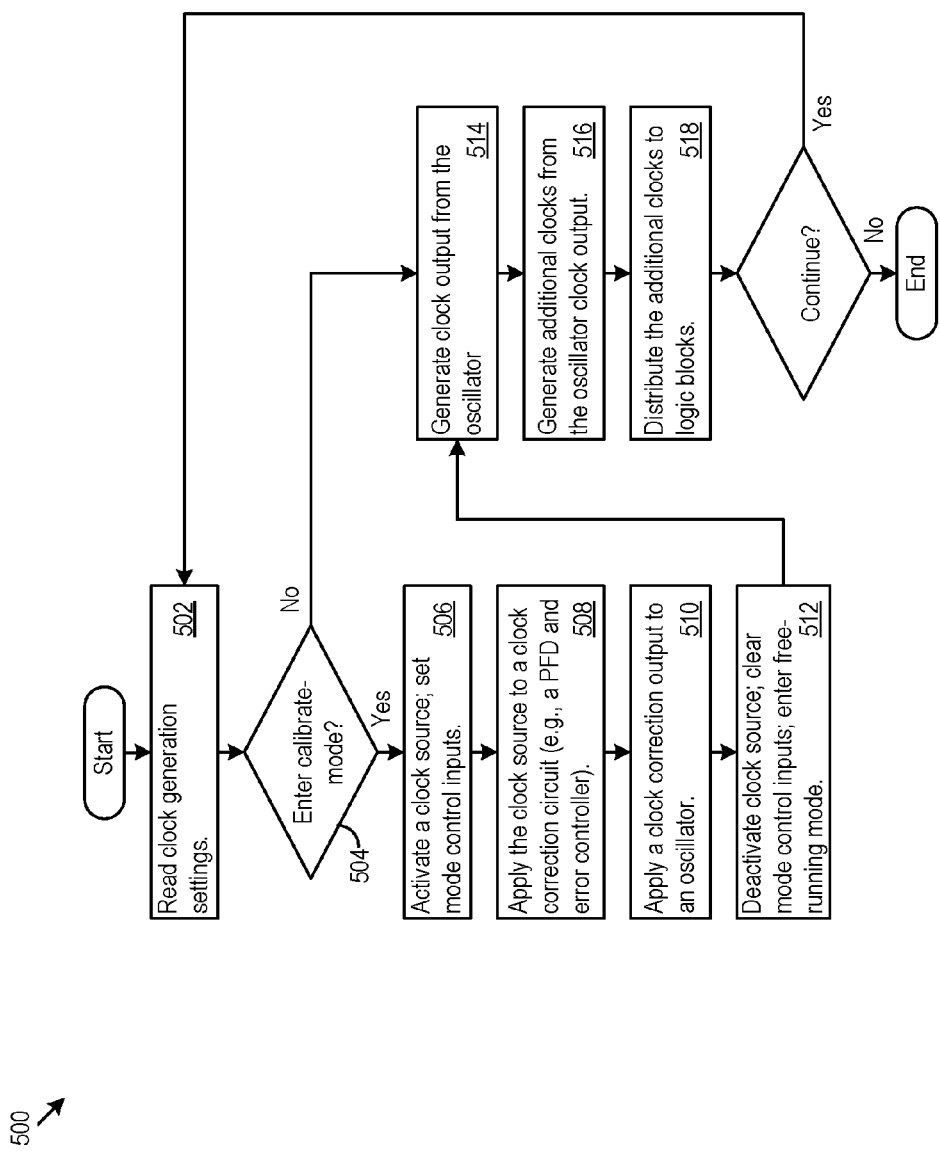
FIG. 5 shows logic for generating clocks.

FIG. 5 shows logic 500 for generating clocks that may be implemented in hardware, software, or both, e.g., in firmware executed by the baseband processor 212. If there are any, the logic 500 reads the clock generation settings 400 (502). If the clock generation settings 400 specify that the oscillator 306 should be calibrated (504), then the logic 500 may activate the clock source 208 and set any mode control inputs accordingly (506), if it is not already active. Note also that the logic 500 may always enter the calibrate-mode when the clock source 208 is active, or may only enter calibrate-mode when other criteria (e.g., those specified in the clock generation settings) are also met.

When in calibrate-mode, the logic 500 applies the clock source to clock correction circuitry (508). The clock correction circuitry may include, e.g., the PFD 302 and error controller 304. The clock correction circuitry outputs a clock correction output to an oscillator (510), thereby calibrating the oscillator. After calibration, the logic 500 may also deactivate the clock source, and clear the mode control inputs to set free-running mode for the oscillator (512).

The oscillator generates a clock output (514) in both free-running mode and calibrate-mode. From the clock output, the clock generation logic 300 and frequency dividers 310, 312 generate additional clocks (516), such as the audio processing reference clock 218. These additional clocks are distributed to the logic blocks within the device 100 (518).

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

Various implementations have been specifically described. However, many other implementations are also possible.

What is claimed is:

1. A method comprising:
   running an oscillator in a free-running mode to generate an output clock;
   determining whether a reference clock source is active;
   receiving a request from a cellular baseband to enter a calibrate-mode in which the oscillator receives a calibration signal to correct the output clock from a phase-frequency detector;
   when the reference clock source is active and responsive to the request;
      activating a phase-frequency detector via a calibration mode input;
      switching the oscillator to a calibrate-mode in which the oscillator receives a calibration signal to correct the output clock;
   determining whether the reference clock source has gone inactive; and
   when the reference clock source has gone inactive, placing the oscillator back in the free-running mode.

2. The method of claim 1, further comprising:
   generating the calibration signal from the reference clock source and the output clock.

3. The method of claim 1, further comprising:
generating additional clocks from the output clock.

4. The method of claim 3, where the additional clocks include an audio processing reference clock.

5. The method of claim 3, where the additional clocks include a system reference clock for housekeeping operations.

6. The method of claim 1, where switching the oscillator to the calibrate-mode comprises:
asserting a mode control input to clock correction circuitry.

7. The method of claim 1, determining whether the reference clock source is active comprises:
determining whether a cellular communication reference clock is active.

8. The method of claim 1, further comprising:
determining whether a clock generation setting has been met; and
where switching the oscillator to the calibrate-mode comprises:
switching the oscillator to the calibrate-mode when the clock generation setting has been met.

9. A system comprising:
an oscillator operable to generate an output clock in both a free-running mode and a calibrate-mode;
a mode control input operable to:
select the free-running mode for the oscillator by deactivating a phase-frequency detector; and
select the calibrate-mode for the oscillator by activating the phase-frequency detector; and
control circuitry configured to control the mode control input to set the free-running mode and the calibrate-mode responsive to a reference clock source input.

10. The system of claim 9, where:
the control circuitry is configured to set the calibrate-mode when the reference clock source provides a reference clock signal.

11. The system of claim 9, further comprising:
clock correction circuitry coupled to the mode control input; and where:
the mode control input is configured to connect the clock correction circuitry to the oscillator in calibrate-mode and disconnect the clock correction circuitry from the oscillator in free-running mode.

12. The system of claim 9, where:
the output clock comprises an audio processing clock.

13. The system of claim 9, where:
the output clock comprises a system reference clock.

14. The system of claim 9, further comprising:
a memory configured to store a clock generation setting that specifies when the oscillator should be in calibrate-mode.

15. The system of claim 14, where:
the clock generation setting specifies a cellular communication connection capability setting.

16. The system of claim 15, where:
the reference clock source input comprises a cellular communication reference clock source input.

17. The system of claim 16, where:
the control circuitry is configured to activate a reference clock source that generates a reference clock on the reference clock source input, instead of deactivating the reference clock source responsive to the cellular communication connection capability setting.

18. The system of claim 17, where:
the control circuitry is operable to activate the reference clock source in order to calibrate an audio processing reference clock obtained from the output clock of the oscillator.

19. A system comprising:
clock generation circuitry comprising:
a mode control input;
clock correction circuitry coupled to the mode control input, the clock correction circuitry configured to generate a calibration signal from an output clock and a reference clock; and
an oscillator coupled to the clock correction circuitry, the oscillator configured to generate the output clock;
a reference clock source input coupled to the clock correction circuitry, the reference clock source configured to send the reference clock to the clock correction circuitry; and
a baseband controller configured to:
determine a criterion is met for entering a calibrate-mode in which the oscillator receives the calibration signal from the clock correction circuitry;
determine whether the reference clock source is active;
when the reference clock source is active and responsive to the criterion, set the mode control input to place the oscillator into the calibrate-mode;
determine whether the reference clock source has gone inactive; and
when the reference clock source has gone inactive, set the mode control input to place the oscillator into a free-running mode.

20. The system of claim 19, where the mode control input is configured to activate a phase frequency detector, an error controller, or both to place the oscillator into the calibrate-mode.

* * * * *